United States Patent [19]

Iversen

[11] Patent Number: 5,018,570
[45] Date of Patent: May 28, 1991

[54] METHOD AND APPARATUS FOR MANUFACTURING COMPOSITE SUPERCONDUCTING STRIP

[75] Inventor: Arthur H. Iversen, Saratoga, Calif.
[73] Assignee: Coriolis Corporation, Saratoga, Calif.
[21] Appl. No.: 399,432
[22] Filed: Aug. 23, 1989

Related U.S. Application Data

[60] Division of Ser. No. 119,338, Nov. 10, 1987
[51] Int. Cl.$^5$ .................. B22D 11/06; B22D 19/16
[52] U.S. Cl. .................. 164/461; 164/463; 164/480; 505/915; 505/733
[58] Field of Search .......... 164/461, 463, 423, 47, 164/66.1, 67.1, 76.1, 91, 133, 135, 259, 459, 461, 462, 473, 475, 415, 479, 480, 427, 428, 429, 418, 477, 417, 270.1; 505/733, 739, 741, 913–916

[56] References Cited

U.S. PATENT DOCUMENTS

| | | | |
|---|---|---|---|
| 4,221,257 | 9/1980 | Narasimhan | 164/463 |
| 4,314,835 | 2/1982 | Pelton | 164/79 |
| 4,326,579 | 4/1982 | Pond Sr. et al. | 164/463 |
| 4,480,373 | 11/1984 | Geskin | 164/461 |
| 4,546,811 | 10/1985 | Potard | 164/66.1 |
| 4,791,979 | 12/1988 | Liebermann | 164/415 |

FOREIGN PATENT DOCUMENTS

| | | | |
|---|---|---|---|
| 0126267 | 11/1984 | European Pat. Off. | 164/463 |
| 55-73448 | 6/1980 | Japan | 164/480 |
| 56-47247 | 4/1981 | Japan | 164/461 |
| 57-137059 | 8/1982 | Japan | 164/463 |
| 61-119354 | 6/1986 | Japan | 164/423 |

OTHER PUBLICATIONS

"High Tc Superconductivity of a Melt-Spun $Er_1Ba_2Cu_3$ Oxide Ribbon", by Matsuzaki, et al., p. L1384, Japanese J. of Applied Physics, vol. 26, No. 8, Aug. 1987.

Primary Examiner—Kuang Y. Lin
Attorney, Agent, or Firm—Foley & Lardner

[57] ABSTRACT

A method and apparatus are disclosed for the manufacture of a sheathed superconducting ceramic strip. The apparatus includes a chill wheel and metal casting apparatus wherein means are provided within the metal casting apparatus to cause oxygen to react with molten metal, comprising the base alloy from which a superconducting ceramic is formed, in a controlled manner. Strips of superconducting ceramic partially sheathed in the molten metal emerge from the metal casting apparatus and are engaged by the chill wheel, which solidifies the molten metal to form a continuous strip.

5 Claims, 2 Drawing Sheets

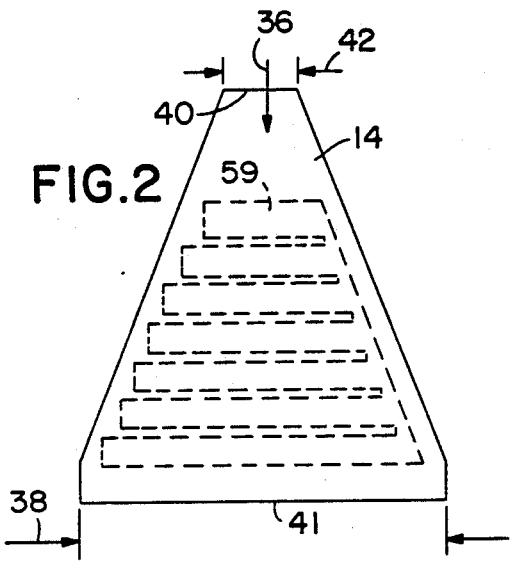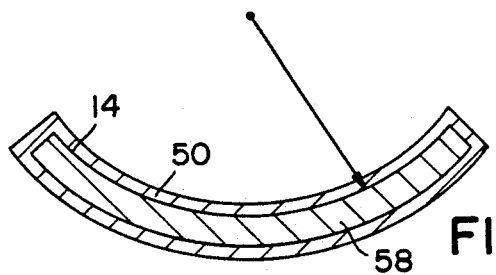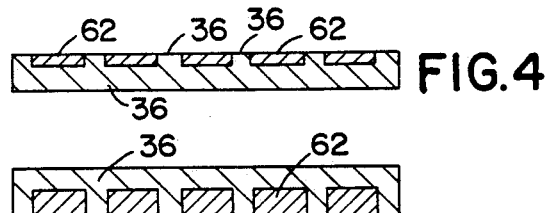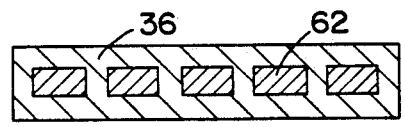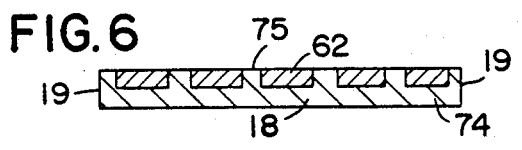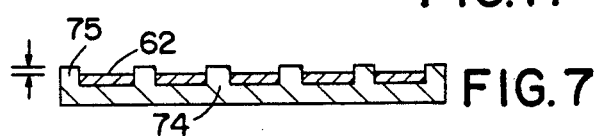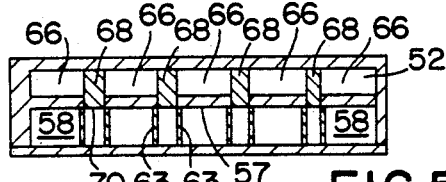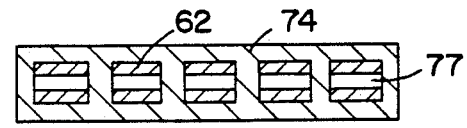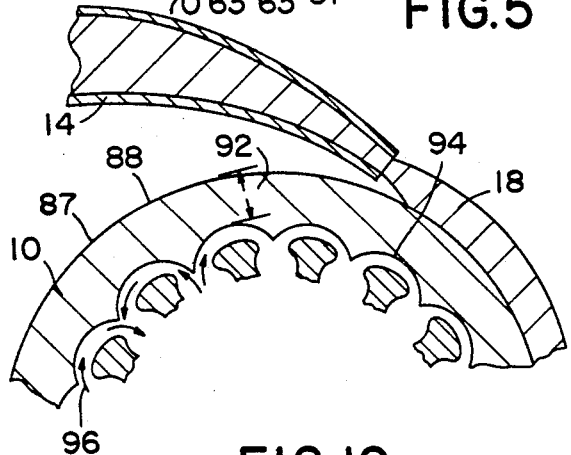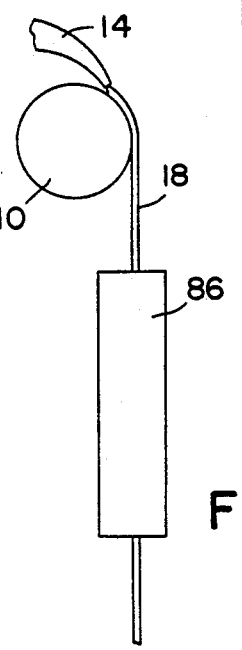

METHOD AND APPARATUS FOR MANUFACTURING COMPOSITE SUPERCONDUCTING STRIP

This a divisional of Application Ser. No. 119,338 filed Nov. 10, 1987, abandoned.

BACKGROUND OF THE INVENTION

1. Field of the Invention

The invention relates to the casting of metallic strips. More particularly, it relates to the continuous casting of a superconducting ceramic strip wholly or partially sheathed in a protective metallic shell.

2. Description of the Prior Art

The fabrication of high temperature superconducting ceramics such as $YB_{A2}Cu_3O_{7D}$ here consisting of yttrium, barium, copper and oxygen, which may also contain other materials such as strontium for the barium and another rare earth element for the yttrium, presents a number of difficulties centering around the chemical stability of the end product. For example, reheating the superconducting ceramic can cause reduction of oxygen content with consequent reduction, or even loss of, superconducting properties. Moisture also has an adverse effect on the superconducting properties of the above-described ceramic. A solution to the foregoing problem is to seal or encapsulate the superconducting ceramic by some suitable means, e.g. plastic, metal housings, etc. Such a method has the disadvantage of requiring two separate steps which lead to higher costs as well as presenting the potential problem of degradation of the superconducting properties of the ceramic due to environmental (moisture, contamination, etc.) and handling factors.

SUMMARY OF THE INVENTION

The present invention provides an apparatus and method for the continuous casting of a superconducting ceramic strip wholly or partially encased in a protective metallic strip.

The present invention further provides an apparatus and method for the continuous casting of multiple superconducting ceramic strips wholly or partially encased in a protective metallic strip.

The foregoing are accomplished by providing one or more chill wheels with metal casting apparatus that include means to convert at least one surface of the flowing molten metal into a superconducting ceramic. Such means to convert the molten metal includes introduction of a fluid, e.g. gas, vapor etc. A gas such as oxygen, or a reactive vapor, reacts with the molten metal in such manner as to provide the desired superconducting ceramic composition. A further alternative would be to provide a solid reactive material whose surface is part of the molten metal casting apparatus such that, as the reactive material is consumed, it is continuously fed so as to maintain the initial surface geometry.

The metal casting apparatus according to one embodiment of the invention causes the strip of molten metal and ceramic superconducting material to be deposited on each chill wheel in such manner that where the strips join, at approximately the line joining the axis of each of the chill wheels, the surface of the cast metal is still sufficiently hot or molten that the two strips join, effectively forming one strip with the superconducting ceramic sealed inside. Alternatively, a single chill wheel and metal casting apparatus may be employed to produce a partially sheathed superconducting ceramic strip.

BRIEF DESCRIPTION OF THE DRAWINGS

A preferred exemplary embodiment of the present invention will hereinafter be described in conjunction with the appended drawing, where like designations denote like elements; and:

FIG. 2 is a top view of the metal casting apparatus of FIG. 1;

FIG. 3 is a cross-sectional view taken along the line III—III in FIG. 1 showing curvature of the metal casting apparatus to increase lateral spread of molten metal;

FIG. 4 is a cross-sectional view taken along the line IV—IV in FIG. 1 (chill wheel omitted) of a metal strip containing multiple superconducting ceramic strips with one surface exposed;

FIG. 5 is a cross-sectional view taken along the line V—V in FIG. 1 of a metal casting apparatus conduit designed to deliver reactive gas or vapor to flowing molten metal contained in an adjacent conduit (molten metal omitted);

FIG. 6 is a cross-sectional view of an alternative strip according to the invention made of a different base metal than that from which multiple strip superconducting ceramic was fabricated;

FIG. 7 is a cross-sectional view of a alternative strip according to the invention containing multiple superconducting ceramic strips, wherein the metallic strip portion protrudes above the superconducting strips;

FIG. 8 is a cross-sectional view of two strips according to FIG. 7 fused together, illustrating a conduit contained in the superconducting strip;

FIG. 9 is a schematic diagram of an alternative embodiment wherein a composite strip containing a superconducting ceramic strip, with on surface exposed, passes through an apparatus that optimizes the oxygen content of the superconducting ceramic strip;

FIG. 10 is a partial, cross-sectional view of a chill wheel in contact with a strip according to the invention wherein the surface temperature is controlled by the thickness of the chill wheel wall;

FIG. 11 is a cross-sectional view of two strips according to the invention fused together, enclosing therein multiple ceramic superconducting strips.

DETAILED DESCRIPTION OF PREFERRED EXEMPLARY EMBODIMENTS

Figure 1:
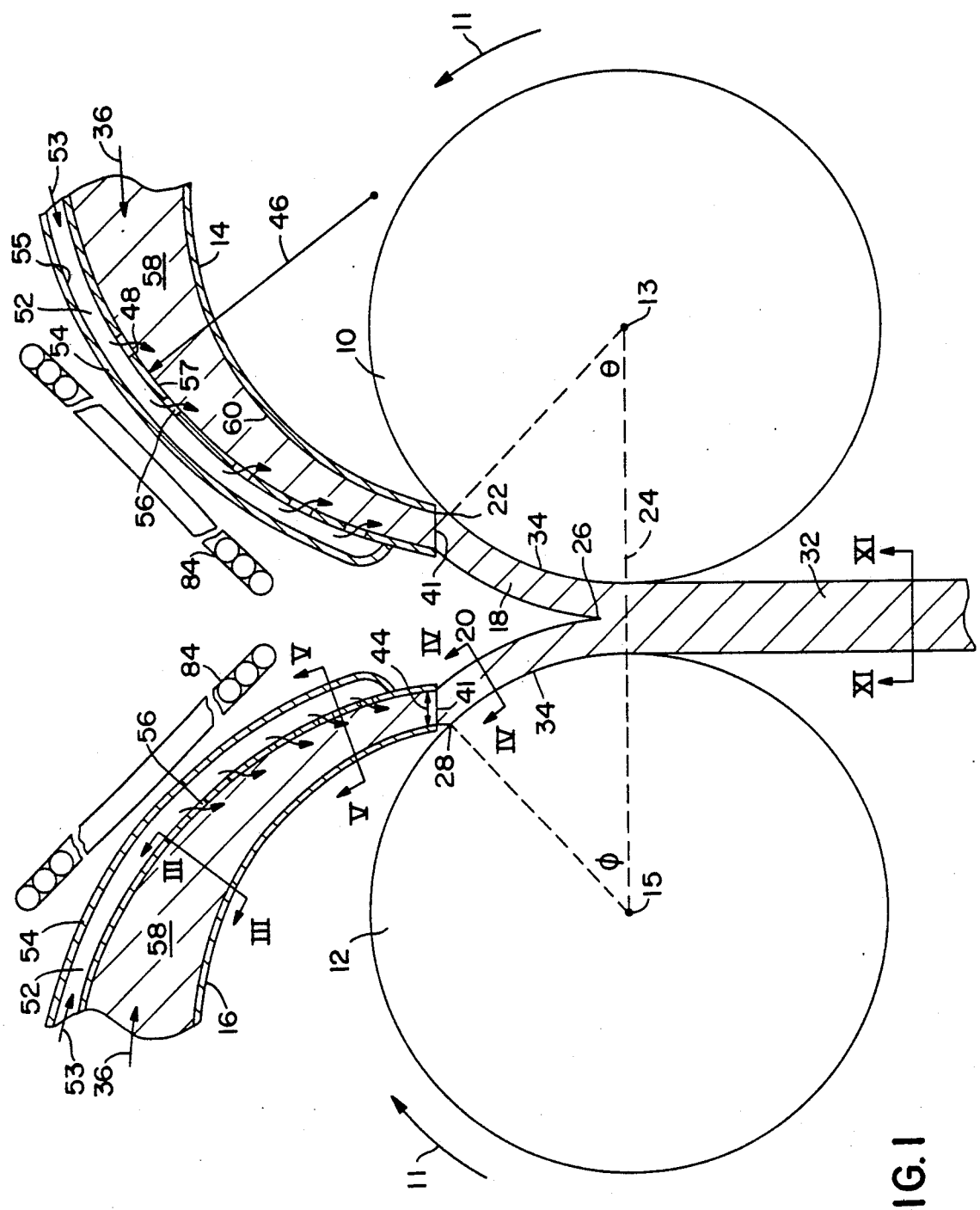
FIG. 1 shows schematic dual chill wheels and a cross-section view of metal casting apparatus with superconducting ceramic forming means according to the invention.

For the purpose of the present invention and as used in the specification and claims, a strip is a slender body the transverse dimensions of which are smaller than its length. Thus, a strip includes a wire, ribbon, sheet or the like of regular or irregular cross-section.

Referring now to FIG. 1, two rotating chill wheels 10, 12 are shown rotating in directions 11, and are disposed in combination with accompanying respective metal casting apparatus 14, 16 into which molten metal 36 is fed under pressure from a crucible (not shown). The strips of molten metal 18, 20 ejected from casting apparatus 14, 16 contact chill wheels 10, 12 at points 22, 28 on chill wheels 10, 12 which are displaced by angles θ & φ from radial line 24 joining the axes 13, 15 of chill wheels. In general, θ and φ will be equal. At point 26, which is close to line 24, the two strips of metal join and fuse to form a single strip 32.

The heat removal properties of chill wheels 10, 12 and the characteristics of the molten metal strips 18, 20, (e.g. thickness, temperature, specific heat etc.) in combination with the disposition of points 22, 28, are selected such that at point 26, the joining point of the two strips 18, 20, their surface temperatures and the bonding pressure are sufficient to cause strips 18, 20 to fuse into a single strip 32. The cooling of the strip 18, 20 outer surfaces 34 in contact with chill wheels 10, 12 through angles θ, φ is such that sufficient solidification has taken place whereby fused strip 32 has adequate rigidity upon emerging from chill wheels 10, 12.

FIG. 2 is a top view of casting apparatus 14, (or 16) showing a flaring from a narrow width 42 at the crucible junction (inlet) 40 where molten metal 36 enters said apparatus to a large width 38 and small height 44 (FIG. 1) where strips 18, 20 emerge from orifice 41 prior to contacting on chill wheels 10, 12 at points 22, 28. This design has the advantage of allowing relatively large orifices to be used at the entrance 40 for metal casting apparatus 14, 16, thereby more readily permitting control of molten metal flow by varying the cross-section of said orifice. Blockage of entrance 40 by chilled metal is also minimized.

To facilitate the uniform spreading of input molten metal 36 of width 42 in apparatus 14, 16 to large discharge width 38, apparatus 14, 16 may be curved (FIG. 1) with a radius 46. The molten metal 36 flowing over concave curved surface 48 creates a centrifugal force, proportional to $$\frac{v^2}{R},$$

where v is the velocity of the molten metal 36 and R is the instantaneous radius of curvature 46 which causes the molten metal to spread at right angles to the direction of flow, i.e. increase in width. FIG. 3, shows another curvature 50, orthogonal to curvature about radius, 46 of FIG. 1. Curvature 50 generates another centrifugal force due to the lateral spread, (velocity) of the molten metal which further assists in the uniform spreading of molten metal 36. Depending on the spreading characteristics desired, the curvatures may be concave or convex, or a combination thereof. Thus, molten metal strips 18, 20 emerging from casting apparatus 14, 16 are made of predetermined uniform thickness 44 and width 38.

To fabricate sheathed superconducting ceramics, the following steps are added to the previously described process. Referring again to FIG. 1, each metal casting apparatus 14, 16 further has a conduit 52 delineated by a wall (sheet) 54 and the opposing wall 57 of casting apparatus 14. Inlets 56 in walls 57 may comprise porous members, or the entire wall 57 may be porous. Inlets 56 conduit 52 with conduit 58 carrying molten metal 36. Inlets 56 (or wall 57 made of porous material) permits the passage of gas or vapor and prevent the molten metal from flowing from conduit 58 into conduit 52. Preferably, molten metal 36 does not wet porous inlet 56 or wall 57. For this purpose wall 57 and conduit 56 may be made of ceramic. Gas such as oxygen, or a reactive vapor, having oxygen as a decomposition products is introduced under pressure into conduit 52. The gas or vapor then passes through inlets 56 (or porous wall 57) into conduit 58 containing molten metal 36. The reaction product of the gas or vapor with molten metal 36 is a superconducting ceramic 62.

In general, the gas or vapor will be trapped against the curved, top inner surface 48 of wall 57 by the flow of metal 36. In addition, the centrifugal force of the flowing molten metal 36 against curved surface 48 will help hold the shape of the flowing metal, i.e. minimize or prevent breakup of the molten metal flow. The extent of the reaction of the gas or vapor with the molten metal will be a function of time and temperature. Time is largely dictated by the velocity of the molten metal 36 and the length of interaction surface 48, and the starting temperature is that of the molten metal in the melt crucible.

The reaction of the gas or vapor with the molten metal may be accelerated by converting the gas or vapor into a plasma (partially ionized gas) by suitable means such as an applied electric (AC or DC) field and, if appropriate, magnetic fields. Use of a the plasma reduces the temperature required to achieve the desired reaction between the molten metal and gas, thereby allowing improved control of the oxide formation. To obtain an electrically (AC or DC) induced plasma, a preferred embodiment of the present invention comprises a wall 54 (FIG. 1) made of metal and a wall 57 made of ceramic. Wall 54 serves as one electrode and the flowing molten metal 36 serves as the other electrode, with the gas and porous ceramic wall 57 in between. The AC or DC electric field serves to induce a plasma in conduit 52, in the pores of porous ceramic 57 and at the gaseous interface surface of molten metal 36. A magnetic field may be superimposed on the plasma to magnetically confine it, thereby providing further control over the plasma characteristics.

A further method for controlling the characteristics of the plasma involes using or superimposing an RF field. This may be achieved by employing an RF induction coil 84 as, for example, shown in FIG. 1. To employ an RF field, wall 54 must be made of a non-conductor, such as ceramic, and the inside surface 55 of wall 54 is metallized with, for example, an electrode 59 pattern, (FIG. 2), to provide the electrode required for the electric discharge. Alternatively, a metal electrode may be mounted on inside surface 55, i.e. in each of conduits 52. Electrode pattern 59 is designed to avoid coupling by the RF field from coil 84, thereby enabling the RF field to penetrate conduit 52 and porous ceramic 57 finally couple into molten metal 36. The RF field can also maintain temperature control of molten metal 36 by heating it.

In the melt crucible, a metal alloy 36 of copper, barium and yttrium of proper proportion, sometimes hereafter referred to as superconductor base metal (or base metal) is prepared. In general, this composition requires a temperature of about 950° C. in oxygen to form optimum $Y Ba_2Cu_3O_{7-x}$ superconducting ceramic. This is one of the better known metal compositions that is the basis for superconducting ceramics, to which oxygen must be added. The molten alloy 36 is injected into conduit 58 and flows toward discharge orifice 41. The surface of molten metal 36 flowing over casting apparatus surface 48, reacts with the gas, e.g. oxygen, or vapor emerging from inlets 56 or porous wall 57 to form the desired ceramic superconducting ceramic 62 composition to a controlled depth (FIG. 4) in molten metal 36. On button surface 60 of casting apparatus 14, 16 opposite surface 48, the molten metal 36 is substantially unaffected. Thus, one surface of strips 18, 20 corresponding to top inner surface 48 of casting apparatus 14, 16 contains of superconducting ceramics strips (layers) 62, and the opposite surface corresponding to bottom surface 60 of 14, 16 is metal 36 as shown in FIG. 4.

To insure that the superconducting ceramic is of the desired composition, it may be desirable to operate the chill wheels in a controlled or inert atmosphere, or at reduced or low pressure, i.e., at a partial or high vacuum. Other materials may be introduced into conduit 52 together with the gases or vapors e.g. gases or vapors that act as catalysts or otherwise desirably speed up, slow down or modify the reaction with the molten metal 36 forming the superconducting ceramic 62. Also, material may be added that becomes entrapped within the superconducting ceramic and acts as an oxygen reservoir to either replace lost oxygen or act as a supply of excess oxygen. Methods such as generating an oxygen plasma cause reactions at low temperature, e.g. below 100° C., which can maintain the proper superconducting ceramic composition within the strip after manufacture.

As described in FIGS. 4–8, the superconducting ceramic 62 extends less than the width 38 of discharge orifice 41. The edges 19 of strips 18, 20 remain metal and are not converted to superconducting ceramic 62, so that when strips 18, 20 join at 26, the hot metal edges may fuse thereby sealing the superconducting ceramic in a metallic sheath. Thus, any further handling or operation that could adversely affect the exposed superconductor is minimized or avoided.

A further preferred embodiment of the present invention is to provide multiple parallel super conductor strips sheathed in a metallic strip. This then could comprise a superconductor "ribbon cable" or, the separately sheathed superconductor strips may then be slit into separate single conductor strips. The single wire strip may then be further processed by drawing etc. The foregoing may be accomplished by alternating reactive structure, e.g. inlets 56 or porous wall 57, and non-reactive regions across the width of strips 18, 20.

FIG. 5 illustrates the formation of superconducting ribbon cable. Gas or vapor conduit 52 is alternately divided into conduits 66 and solid walls 68 which may be metal or ceramic. As before, reactive gas or vapor, e.g. oxygen, passes through porous wall 57 from conduits 66 to react with the molten metal 36 and form superconducting ceramic 62. Since there is no reactive gas or vapor passing through solid walls 68, the molten metal 36 in contact with surfaces 70 is substantially unaffected inasmuch as surface 70 is not porous. Thus, alternate segments of ceramic superconductor 62 and metal 36 emerge from metal casting apparatus 14, 16 as shown in FIG. 4. When strips 18, 20 merge at 26, fusion at alternate surfaces of metal 36, occurs to form a single strip 32 (FIG. 1) as shown in cross-section in FIG. 11. Each strip of superconducting ceramic 36 is sheathed in metal 36 to form multi-superconductor strip 32. To further assist in separating and delineating metal 36 segments and superconducting ceramic 62 segments, partitions 63 (FIG. 5) may be incorporated into metal flow conduits 58 in positions corresponding to the boundaries of gas conduits 66. To form a number of single conductor strips, the multi-conductor strip may be slit or otherwise cut approximately midway between superconducting filaments strips 62. The single or multiconductor strip may be further processed by, for example, rolling, drawing, etc.

Another preferred embodiment of the present invention is illustrated in FIG. 6. Metal casting apparatus 14, 16 is modified (not shown) so as to cast molten metal for making superconducting ceramic base metal 36, i.e., metal to be converted to superconducting ceramic, and sheathing a metal 74. Sheathing metal 74 is a different metal than base metal 36. In general, sheathing metal 74 is less reactive than metal 36. The properties of sheathing metal 74 may be selected to meet cost, corrosion resistance, working properties or other desirable criteria thereby optimizing cost and performance. In this embodiment, metal casting apparatus 14, 16 cast strips of superconducting ceramic base metal 36, i.e. prior to reaction with oxygen, embedded in sheathing metal 74. The width of base metal 36 is approximately equal to the width of conduit chambers 66 (FIG. 5). Separating portions 75 of sheathing metal between base metal 36 strips are approximately equal to the width of solid walls 68 of conduit 52. Thus, base metal 36, which is converted to superconducting ceramic is exposed to gases and vapors emerging from orifices 56 (or porous wall 57), and sheathing metal 74 has minimal exposure to gases or vapors because of the shielding provided by solid walls 68. Base metal 36 and sheath metal 74, being of different composition, are melted in separate crucibles and are then fed into modified metal casting apparatus 14, 16 (not shown) such that strip 18 shown in FIG. 6 emerges from orifice 41 (FIG. 1).

An embodiment similar to FIGS. 4 and 6 is shown in FIGS. 7 and 8, wherein separating portions 75 of sheathing metal 74, (or 36) protrude above superconducting ceramic 62, upon fusion of two strips 18, 20, a conduit 77 reaults. Into conduit 77 may be introduced material, either during or after casting, that serves as an oxygen source for maintaining the proper chemical composition of the ceramic superconductor 62 after manufacture. The material in conduit 77 may also be a stabilizing agent that inhibits the loss of oxygen or otherwise preserves the desired characteristics of superconducting ceramic 62. Such material may be introduced into conduit 77 after manufacture by evacuating conduit 77, e.g. in coiled form, and then permitting the material, in a non-aqueous liquid solution, or, for example, as a low viscosity plastic, to flow through conduit 77 by capillary action or other means. The liquid carrier may be removed by evacuation and/or heating at low temperature. Conduit 77 may be then backfilled with oxygen or other gas, e.g. an inert gas, or a material, e.g. plastic.

It should be noted that though two chill wheels 10, 12 (FIG. 1) cooperate to bring together and fuse two strips 18, 20 to provide sheathed superconductors, a single chill wheel 10 and metal casting apparatus 14 may be used to provide superconducting ceramic 62 embedded in metal with one superconducting ceramic surface exposed as shown in FIGS. 4 and 6. This embodiment may be used to wind coils for electromagnets, stators for motors and may be used in other applications that require an electomagnetic field. A further benefit of partially exposed superconducting ceramic lies in the ability to heat the strip 18, 20 in oxygen, during or after strip fabrication (in a continuous process), at approximately 450° C. to optimize oxygen content. Alternatively, the strip may be passed through an oxygen plasma at low temperature, e g. 100° C, to optimize oxygen content, preferably during fabrication. Referring now to FIG. 9, strip 18 containing superconducting ceramic is released from chill wheel 10 and enters apparatus 86 which heats strip 18 and provides an oxygen or oxygen rich gas or vapor that reacts with the superconducting ceramic at a suitable temperature, e.g. 450° C. to optimize oxygen content. Alternately, apparatus 86 contains means to generate a plasma, e.g. oxygen, in the presence of strip 18 which is at a suitable temperature, e.g. 80° C. The foregoing may be established on a continuous strip production line where long, continuous lengths of a strip may be fabricated. The completed coil may then be sealed, e.g. hermetically, by encapsulation in suitable media such as plastic, etc., or may be encased in glass, metal etc. to protect it from adverse environmental factors such as moisture, carbon dioxide, etc.

FIG. 2 shows the top of metal casting apparatus 14. To obtain strip widths larger than 38, multiple metal casting apparatus 14 or 16 are place adjacent each other at discharge slits 41 such that the emerging flows of molten metal 36 join smoothly at the adjoining edges, thereby providing a continuous and uniform strip whose width is a multiple of width 38.

FIG. 10 illustrates a chill wheel 10 (or 12) wherein the chill wheel surface 87 is prepared with a suitable "seed" crystal structure 88, such that when molten strip 18 is deposited on chill wheels 10 an epitaxial film grows. Epitaxial films are those in which most of the crystals have their long axis at right angles to the plane of the film, i.e. the strip. To the extent that they are useful, electric and/or magnetic fields may also be employed To optimize epitaxial film growth in strip 18, 20, the temperature of chill wheel surface 87 may be controlled by providing chill wheels 10 with a wall thickness 92 such that a prescribed surface temperature is achieved. The surface temperature is the thermal resistivity of wall 88 multiplied by the heat flux from the molten metal, plus the boiling temperature of the liquid coolant. The thermal resistivity is $$R_T = \frac{d}{k},$$

where d is the thickness of the chill wheel wall at 92 and k is its thermal conductivity. The cooling rate of strip 18 is determined by the surface temperature of chill wheel 10. By maintaining an elevated surface temperature at chill wheel surface 87, further control of ceramic superconductor characteristics is obtained, e.g., a hot chill wheel surface slows the cooling rate, thus effecting the ordering of oxygen vacancies in the Y $Ba_2Cu_3O_{7-x}$ grains. Further ordering may be achieved in apparatus 86, FIG. 9. Efficient heat transfer is desired at liquid cooled surfaces 88 of chill wheel 10 to enable high heat fluxes to be dissipated at wheel surface 88. Efficient nucleate boiling heat transfer may be effected by incorporating concave curved liquid cooled heat transfer surfaces (passages) 94 within chill wheel 10. The flow of nucleate boiling coolant 96 over concave curved heat transfer surface 94 generates a centrifugal force which enhances heat transfer by the rapid removal of nucleate bubbles. With efficient chill wheels, and associated rapid solidification, the metal sheathing surrounding the superconducting ceramic may be completely or partially amorphous or microcrystalline due to the rapid chill rate. Amorphous or microcrystalline metals have superior working properties corrosion resistance, and other properties. The above described efficient chill wheel may be applied to all the preferred embodiments of sheathed superconducting strip described herein. Although chill wheels have been described in the preferred embodiments herein, chill belts or other suitable means may also be adapted to cool strips 18, 20 at predetermined rates.

It will be understood that the above description is of preferred exemplary embodiments of the present invention and that the invention is not limited to the specific forms shown. Modifications may be made in the design and arrangement of the elements without departing from the spirit of the invention as expressed in the appended claims.

I claim:

1. A method for producing a composite strip having a metal component and a continuous metal compound component, comprising the steps of:

forming a stream of molten metal in an enclosed casting conduit within a casting apparatus;

feeding a reactive fluid into a fluid conduit within said casting apparatus and through an inlet of said casting conduit;

contacting a surface region of said molten metal, while said molten metal is within said casting conduit, with said reactive fluid in such a manner that said reactive fluid is trapped against an inner surface of said casting conduit by the flow of molten metal therethrough to thereby form said continuous metal compound at said surface region of said molten metal;

thereafter discharging said stream of molten metal from said casting apparatus; and chilling said stream of molten metal to form a composite metal strip.

2. The method of claim 1 wherein said contacting step comprises contacting said molten metal with a gas having oxygen as a constitutent and which reacts with said molten metal to form a metal oxide compound.

3. The method of claim 1 wherein said contacting step comprises contacting said molten metal with said reactive fluid such that a major part of the exterior of said molten metal is substantially free of contact with said fluid.

4. The method of claim 1, wherein said chilling step comprises depositing said composite strip onto a round outer peripheral surface of a rotating chill wheel.

5. A method for producing a composite strip having a metal component and a continuous metal compound component disposed in predetermined surface regions thereof, said method comprising the steps of:

feeding a continuous supply of molten metal through a casting conduit in a casting apparatus to thereby form a stream of molten metal;

feeding a reactive fluid into a fluid conduit located adjacent said casting conduit and through an inlet portion of said casting conduit;

contacting a surface portion of said molten metal with said reactive fluid during said step of feeding said continuous supply of molten metal in such a manner that said reactive fluid is trapped against an inner surface of said casting conduit by the flow of molten metal therethrough so that said predetermined surface regions of said molten metal react with said reactive fluid to form said continuous metal compound component in said surface regions of said molten metal; then discharging said stream of molten metal out of said casting conduit; and then chilling said stream of molten metal to form a composite metal strip; wherein said step of feeding said reactive fluid comprises feeding said reactive fluid through an inlet comprising a porous wall disposed between said casting conduit and said fluid conduit, which porous wall allows said reactive fluid to permeate therethrough but is impermeable to said molten metal.

* * * * *